(12) United States Patent
Chheda et al.

(10) Patent No.: US 6,970,001 B2
(45) Date of Patent: Nov. 29, 2005

(54) VARIABLE IMPEDANCE TEST PROBE

(75) Inventors: Sachin Navin Chheda, Roseville, CA (US); Robert William Dobbs, Granite Bay, CA (US); Andrew Barr, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 70 days.

(21) Appl. No.: 10/370,537

(22) Filed: Feb. 20, 2003

(65) Prior Publication Data

US 2004/0164748 A1   Aug. 26, 2004

(51) Int. Cl.[7] .................. G01R 27/28; G01R 31/02
(52) U.S. Cl. ..................... 324/649; 324/72.5
(58) Field of Search ................. 324/649, 600, 324/72.5, 757, 158.1, 765, 754, 755, 437, 324/445–447, 715, 724, 751, 752, 758, 690, 324/696, 658, 661, 662, 663, 671, 686; 702/47, 702/52

(56) References Cited

U.S. PATENT DOCUMENTS

| | | | |
|---|---|---|---|
| 3,256,484 A | | 6/1966 | Terry |
| 3,452,275 A | | 6/1969 | Haines et al. |
| 3,629,701 A | | 12/1971 | Ichijo |
| 3,987,390 A | * | 10/1976 | Kirklen et al. ............. 324/713 |
| 4,016,492 A | * | 4/1977 | Miller et al. ............... 324/128 |
| 4,621,226 A | | 11/1986 | Powell |
| 4,952,869 A | * | 8/1990 | Tuttle ....................... 324/126 |
| 5,107,201 A | * | 4/1992 | Ogle ........................ 324/72.5 |
| 5,135,485 A | * | 8/1992 | Cohen et al. ................ 604/67 |
| 5,140,272 A | * | 8/1992 | Nishimatsu et al. ........ 324/662 |
| 5,417,107 A | * | 5/1995 | Biencourt et al. .......... 73/61.44 |
| 5,546,008 A | * | 8/1996 | Sminchak et al. .......... 324/690 |
| 6,208,161 B1 | | 3/2001 | Suda |
| 6,210,368 B1 | * | 4/2001 | Rogers ....................... 604/131 |
| 6,275,023 B1 | | 8/2001 | Oosaki et al. |
| 6,307,363 B1 | * | 10/2001 | Anderson ................. 324/72.5 |
| 6,311,563 B1 | * | 11/2001 | Ishikura ...................... 73/724 |
| 2002/0173926 A1 | | 11/2002 | McCord |
| 2003/0136189 A1 | * | 7/2003 | Lauman et al. ........... 73/304 C |
| 2003/0218463 A1 | * | 11/2003 | Stierman et al. ........... 324/534 |

FOREIGN PATENT DOCUMENTS

| | | |
|---|---|---|
| GB | 2158592 | 11/1985 |
| GB | 2369264 | 5/2002 |

OTHER PUBLICATIONS

IConnect TDR Software, retrieved from [http://www.tdasystems.com] (2003), pp. 1-4.
CITS500s Controlled Impedance Test System, Polar Instruments 2000, pp. 1-6.

* cited by examiner

Primary Examiner—Anjan Deb
Assistant Examiner—Hoai-An D. Nguyen

(57) ABSTRACT

A variable impedance test probe of the present invention comprises a first signal conductor, a first ground reference conductor, and a first dielectric element disposed between the first signal conductor and the first ground reference conductor. The dielectric element is configured to selectively vary an impedance of the first signal conductor relative to the ground reference conductor.

15 Claims, 5 Drawing Sheets

VARIABLE IMPEDANCE TEST PROBE

THE FIELD OF THE INVENTION

The present invention generally relates to testing electrical signal attributes, and more particularly to test probes employed to test electrical signal attributes.

BACKGROUND OF THE INVENTION

Design and production of electrical circuitry requires testing various attributes of a signal carried by the circuitry. These signal attributes include parameters such as bit error rate, clock skew, jitter, etc as well as other known parameters associated with electrical circuitry. Testing for these signal attributes is important in both conventional signaling, as well as in differential signaling.

Differential signaling differs from conventional signaling in that a differential signal is the difference in signal values between two entities. Low Voltage Differential Signaling (LVDS) is just one implementation of differential signaling, and comprises a data interface standard used for high-speed transmission of binary data over cooper wires and/or printed circuit board traces. Low Voltage Differential Signaling includes the use of a two-wire system for low power, low noise, and low amplitude data transmission. Low Voltage Differential Signaling is typically applied in a point-to-point physical layer interface such as component-to-component connections via printed circuit board traces. Other examples of differential signaling include high voltage differential signaling (HVDS). Differential signaling shows great promise for accelerating data transmission. However, with Differential signaling even greater attention must be paid to close tolerances in the impedance of transmission lines of a differential signaling interface, such as printed circuit board traces forming a differential pair of transmission lines.

Accordingly, whether investigators are testing conventional signaling or differential signaling, design and production of physical layer interfaces and conductive elements in electrical circuitry layouts would improve with more accurate signal testing.

SUMMARY OF THE INVENTION

One aspect of the present invention provides a variable impedance test probe comprising a first signal conductor, a first ground reference conductor, and a first dielectric element disposed between the first signal conductor and the first ground reference conductor. The dielectric element is configured to selectively vary an impedance of the first signal conductor relative to the ground reference conductor.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment of a test probe of the present invention is directed to enhancing the accuracy of testing signal attributes of electrical circuitry, and enables selectively varying an impedance of the test probe to substantially match an impedance of target conductive element. One embodiment of a test probe of the present invention is implemented in a single ended arrangement for conventional signal testing and is implemented in differential arrangement for differential signal testing.

One embodiment of a single ended arrangement of the test probe includes a single test signal conductor and a ground reference, with a variable dielectric element disposed between the signal conductor and the ground reference for varying an impedance of the single ended test probe. One embodiment of a differential arrangement of the test probe includes two test signal conductors, each spaced from their own ground reference conductor. In one embodiment, a variable dielectric element is disposed between the test signal conductors, and between each signal conductor and its ground reference conductor.

Example variable dielectric element implementations of these test probes include, but are not limited to, an inflatable dielectric fluid chamber that allows selectively varying a spacing between the respective signal conductors and ground reference conductors to thereby selectively vary an impedance between those respective conductors. Through this selective adjustment of the individual impedance between the respective signal conductors and ground reference conductors, the overall impedance of the test probe is adjusted to a desired level. In one embodiment, the impedance of the test probe is adjusted to substantially match the impedance of a target conductive element(s), although the impedance of the test probe is optionally adjustable to any impedance deemed suitable for the purpose of the signal testing.

Figure 1:
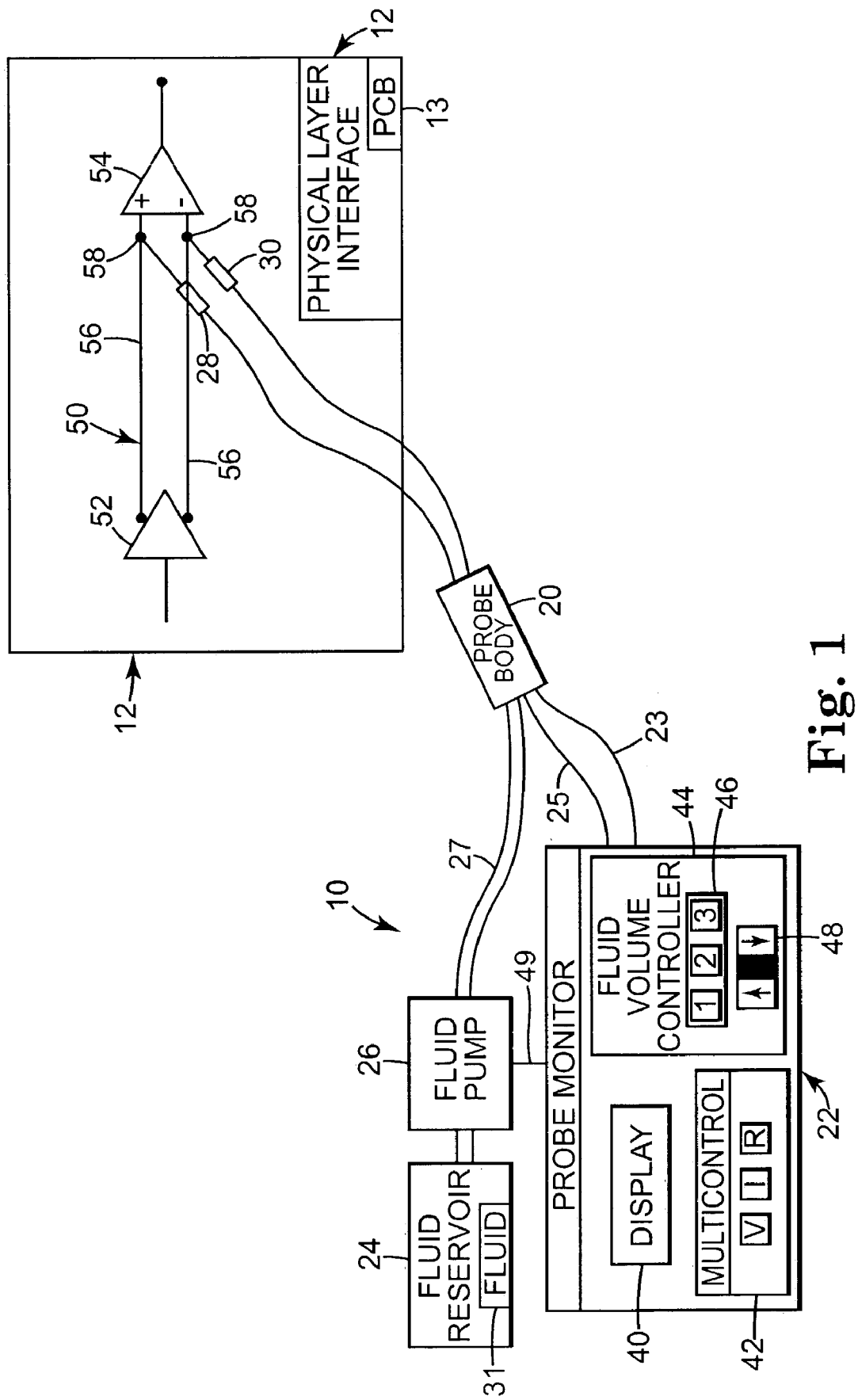
FIG. 1 is a diagram of a test probe system, according to an embodiment of the present invention.

As shown in FIG. 1, an embodiment of a variable impedance test probe system 10 of the present invention is employed for testing different signal integrity attributes of single signals carried on single conductive elements and/or differential signals carried on differential signal elements on, a physical layer interface 12, such as printed circuit board 13. Probe system 10 includes probe body 20, probe monitor 22, fluid reservoir 24, fluid pump 26, and test leads 28,30 extending from probe body 20.

Test leads 28,30 are provided to apply a test signal from probe system 10 to a target conductive element, such as elements 56. Test leads 28 and 30 are both provided when testing differential signaling. However, only one of the test leads 28,30 is used when testing conventional signaling of a single target conductive element, as will be further described later in association with FIGS. 6–9.

In one embodiment, reservoir 24 and probe body 20 are at least partially filled with dielectric fluid 31. Fluid line 27 connects fluid reservoir 24 and fluid pump 26 to probe body 20 while electrical lines 23,25 establish electrical communication between probe monitor 22 and probe body 20. Fluid pump 26 is also in electrical communication with probe monitor 22 via electrical link 49 to permit fluid volume controller 44 of probe monitor 22 to regulate operation of fluid pump 26.

Probe monitor 22 includes display 40, multi-controls 42, and fluid volume controller 44 with chamber controller 46 and volume adjuster 48. Fluid pump 26, in cooperation with fluid volume controller 44 of probe monitor 22, controls the volume of dielectric fluid within probe body 20 for controlling the differential impedance of probe system 10 between test leads 28,30. The structure of probe body 20 and use of dielectric fluid 31 within probe body 20 will be described more fully in association with FIGS. 2 and 3. Accordingly, using volume adjuster 48, fluid pump 26 either pushes additional fluid from fluid reservoir 24 into probe body 20, or pulls fluid from probe body 20 for storage in fluid reservoir 24 to respectively increase or decrease the volume of dielectric fluid within chambers 70,72, and 74. Chamber controller 46 permits directing control of fluid volume in specific chambers (e.g., chamber 1, chamber 2, chamber 3) of probe body 20 via a manifold disposed between pump 26 and probe body 20, as illustrated in more detail in association with FIGS. 2 and 3. Multi-controls 42 enables controlling the measurement and application of voltages, current, and impedance through test leads 28, 30.

Physical later interface 12 (such as printed circuit board 13) includes differential signaling (DS) interface 50 including first logic element 52, second logic element 54, and transmission lines 56 which connect first logic element 52 and second logic element 54. Transmission lines 56 preferably are copper wires and/or printed circuit board traces, and provide merely one example of a target conductive element to which a test signal can be applied by probe system 10 through test lead(s) 28, 30. In the example shown of LVDS interface 50, first logic element 52 comprises a LVDS driver which converts a TTL/CMOS signal into a low-voltage differential signal, which travels at a high speed over transmission lines 56 to a second logic element 54, such as a LVDS receiver which then translates the differential signal back into a TTL/CMOS signal.

Nodes 58 represent exemplary locations along target conductive elements 56 of physical layer interface 12 at which test leads 28,30 of probe system 10 can be applied, such as at the inputs of first logic element 54. Moreover, use of probe system 10 is not limited only to use with printed circuit board, but extends to other differential signaling component-to-component arrangements, and conventional signaling circuitry arrangements (as described in association with FIGS. 6–9).

Figure 2:
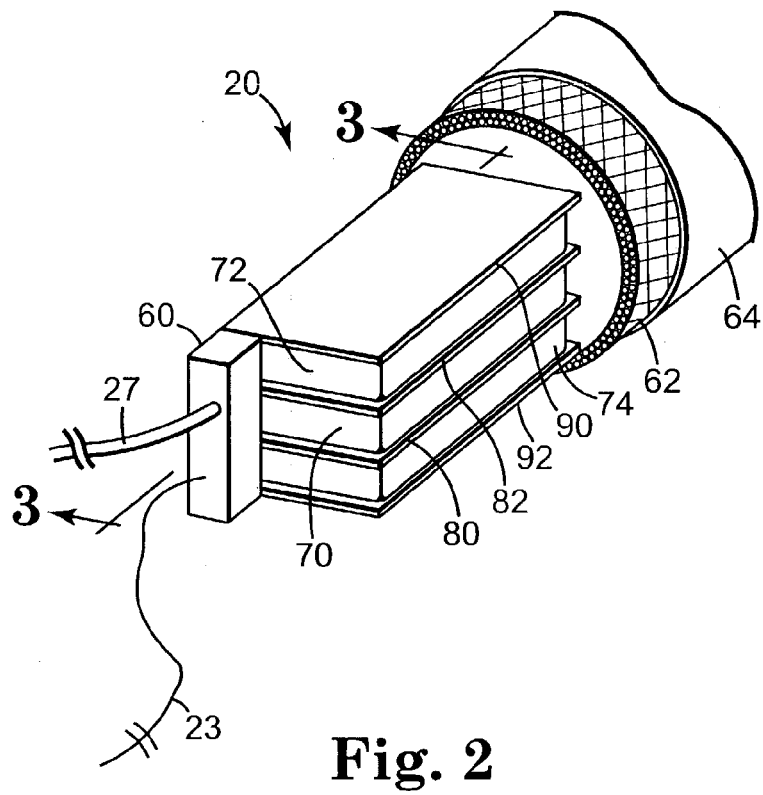
FIG. 2 is perspective view of a test probe, according to an embodiment of the present invention.

FIG. 2 is a perspective view of one embodiment of probe body 20 of probe system 10. As shown in FIG. 2, probe body 20 comprises manifold 60, conductive mesh sheath 62, and outer insulator cover 64. Probe body 20 also comprises first, second, and third inflatable chambers 70, 72,74, respectively. First signal conductors 80 and 82 are disposed on opposite sides of first inflatable chamber 70, which is sandwiched between conductors 80 and 82. Conductors 90 and 92 are disposed on outer surface of second chamber 72 and third chamber 74.

Conductors 80 and 82 are electrically conductive signal elements and conductors 90, and 92 are electrically conductive plates with conductors 90 and 92 provided to act as a ground reference for probe body 20 while conductors 80 and 82 are provided to carry a first and second test signal, respectively, to and from test leads 28,30.

Manifold 60, along with fluid line 27, establishes fluid communication between pump 26 and probe body 20, and will be described in more detail in association with FIG. 3. Conductive mesh sheath 62 preferably is an expandable, generally cylindrically shaped conductive mesh for engaging probe body 20 with a snug, expandable fit. Mesh sheath 62 preferably is connected to a ground reference and acts to protect probe body 20 from interference. Insulating cover 64 is optionally provided as both an electrically and mechanically protective cover.

Figure 3:
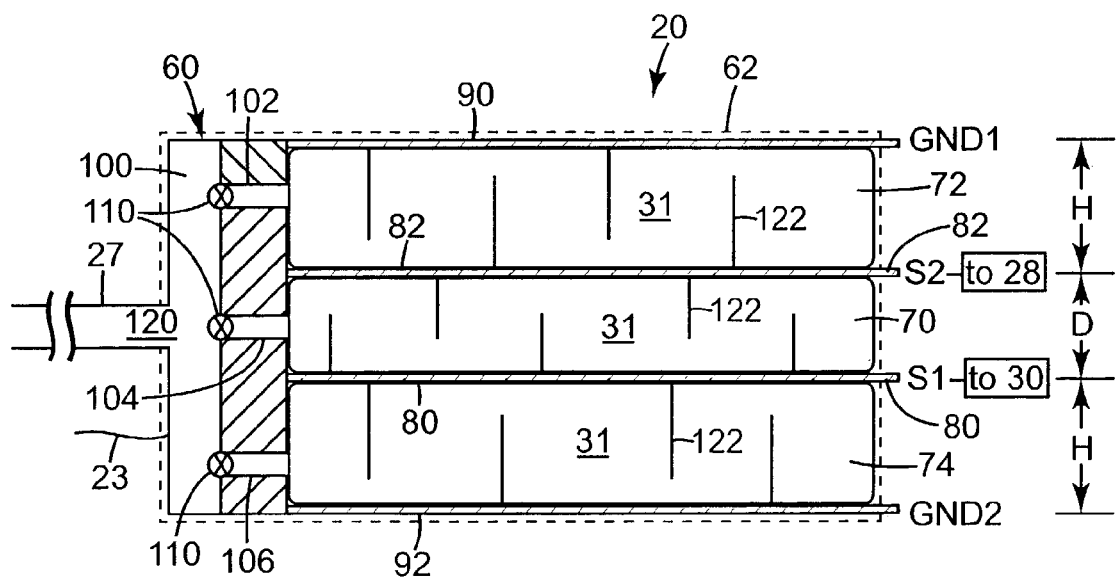
FIG. 3 is a sectional view of FIG. 2 as taken along lines 3—3.

FIG. 3 is a sectional view of FIG. 2 and illustrates inner structure of one embodiment of probe body 20 including manifold 60. Each chamber 70,72, and 74 is filled with dielectric fluid 31, and optionally includes a plurality of baffles 122 for regulating fluid distribution throughout each chamber. Chambers 70,72,74 preferably are made from an inflatable bladder and comprise an elastic or visco-elastic material that expands and contracts m response to a respective increase and decrease of the volume of dielectric fluid 31 within the bladder. Baffles 122 extend throughout each of chambers 70,72,74 for insuring proper flow and distribution of dielectric fluid 31 within chambers 70,72, 74.

Manifold 60 comprises fluid passageway 100, first port 102, second port 104, third port 106, and valves 110. Fluid line 27 is in fluid communication with chambers 70,72,74 via ports 102–106 and fluid passageway 100. Valves 110 are electrically controlled by fluid volume controller 44 of probe monitor 22 via electrical lines 23 and have a variably sized opening, as well as fully open and closed positions for regulating fluid flow through first port 102, second port 104, and third port 106 into respective chambers 70, 72, and 74. Accordingly, manifold 60 is configured, in cooperation with pump, to selectively permit flow of dielectric fluid into and out of one or more of chambers 70,72, and 74.

FIG. 3 also shows distance measurement D, which represents the distance between test signal conductors 80 and 82, and distance measurement H, which represents the distance between first test signal conductor 80 and ground reference conductor 92 and the distance between second test signal conductor 82 and ground reference conductor 90. A first test signal carried on first test signal conductor 80 is represented by notation S1 alongside conductor 80, while second test signal carried on second test signal conductor 82 is represented by notation S2 alongside conductor 82. The first test signal, S1, extends from probe monitor 22 through probe body to test lead 28, while second test signal, S2, extends from probe monitor 22 through probe body 20 to test lead 30. Ground reference conductors 90 and 92 are electrically connected to a ground reference, as represented by the notation GND1 and GND 2 adjacent conductors 90,92.

Conductors 80, 82, 90, and 92 preferably are made of a material that has properties that allow for achieving the range of impedance of target conductive elements 56 (e.g., transmission lines) of physical layer interface 12 to be tested. For example, conductors 80, 82, 90, and 92 preferably are made of copper, although each can be made of a different conductive material, such as an alloy that is substantially the same as alloys used to make tracings (e.g., transmission lines) on a printed circuit board 13. Dielectric fluid 31 is a non-flammable, dielectric fluid such as Flutec, which has known impedance and dielectric characteristics. Flutec™ dielectric fluid is available from F2 Chemicals Ltd (a subsidiary of Asahi Glass Company Ltd, Mitsubishi Corporation and Miteni SpA) of the United Kingdom.

Probe body 20 is constructed by mounting conductors 80 and 82 on opposite sides of chamber 70 with a non-conductive adhesive. This assembly is then inserted into a gap between chambers 72 and 74 with conductors 90,92 being adhesively applied to an outer exposed surface of chambers 72 and 74.

The impedance of probe body 20 is based on a variety of factors—distance of separation between the two signal conductors 80 and 82; distance of separation between the two signal conductors and ground reference planes 90 and 92; width of the signal conductors 80 and 82; thickness of the signal conductors 80 and 82; material used for the signal conductors and the dielectric fluid used 31. A more detailed description of factors affecting impedance is provided in High-Speed Digital System Design, by Hall, Hall and McCall (ISBN 0-471-36090-2). In addition, the geometric spatial relationship between signal conductors 80 and 82 also affects the impedance of probe 20, such as whether a body of conductors 80 82 generally face each other as in FIGS. 2–3 (i.e., signal conductors 80,82 are broad-side coupled) or whether an edge of signal conductors generally face each other, as will be further described later in association with FIGS. 4–5 (i.e., signal conductors 160 and 162 are edge-coupled).

Using all of these parameters of impedance, the impedance of probe 20 is calculated by probe monitor 22, and is monitored via multi-controls 42 and display 40 of probe monitor 22 during adjustment of the impedance of probe 20 and during testing of target conductive elements.

Accordingly, by varying the volume of dielectric fluid 31 within chambers 72 and 74 (via pump 26 and probe monitor 22), an operator can vary distances H, thereby selectively modifying the impedance of the signal conductors 80 and 82 relative to ground reference at conductors 90 and 92. In addition, by varying the volume of fluid 31 within chamber 70, an operator can vary distance D, thereby providing another method to modify the differential impedance for the signal conductors 80, 82.

In use, as shown in FIG. 1, test leads 28 and 30 of probe system 10 are placed at a differential pair of DS nodes 58, such as the end of a pair of target conductive elements 56, such as LVDS transmission lines for testing different signal integrity attributes of the differential pair of target conductive elements 56. Before, during, or after this measurement, the operator adjusts the space between test signal conductors 80 and 82, and/or the space between each test signal conductor 80,82 and its respective ground conductor 90,92 to achieve a target impedance of probe system 10 (and between leads 28,30) that matches, as close as possible, the impedance between target conductive elements 56 (e.g., transmission lines) 56 as measured at target nodes 58.

Adjusting the impedance of probe system 10 is made through fluid volume controller 44 of probe monitor 22, which allows the operator to change the volume of dielectric fluid 31 within chambers 70,72, and 74. Using chamber selector 46 of fluid volume controller 44, the operator selects one or more chambers 70, 72, 74 (represented in chamber selector as chambers 1, 2, and 3) for adjustment and then uses volume adjuster 48 to selectively decrease or increase the volume of fluid 31 via pump 26 within the selected chamber (e.g., chamber 70,72,74). A command of volume adjuster 48 to increase or decrease a fluid volume within a chamber (such as chamber 70) causes a valve 110 of a corresponding port (such as port 104 of manifold 60) to open permitting more fluid to be pushed into that chamber or pulled from that chamber by pump 26. When the desired amount of fluid is achieved in the chamber being adjusted, then fluid volume controller 44 causes valve 110 of the corresponding port to close. Valves 110 also are capable of variably controlling the degree of opening of the valve, as controlled by fluid volume controller 44, to assist in flow management during inflation and deflation of each chamber.

During any adjustment of the fluid volume of one of chambers 70, 72, and 74, the impedance of signal conductors 80,82 relative to each other and/or relative to their respective ground reference conductors 90,92 is displayed on display 40 so that the operator can adjust the fluid volume until the desired impedance level is achieved for entire probe body 20 and also displayed on display 40.

Figure 4:
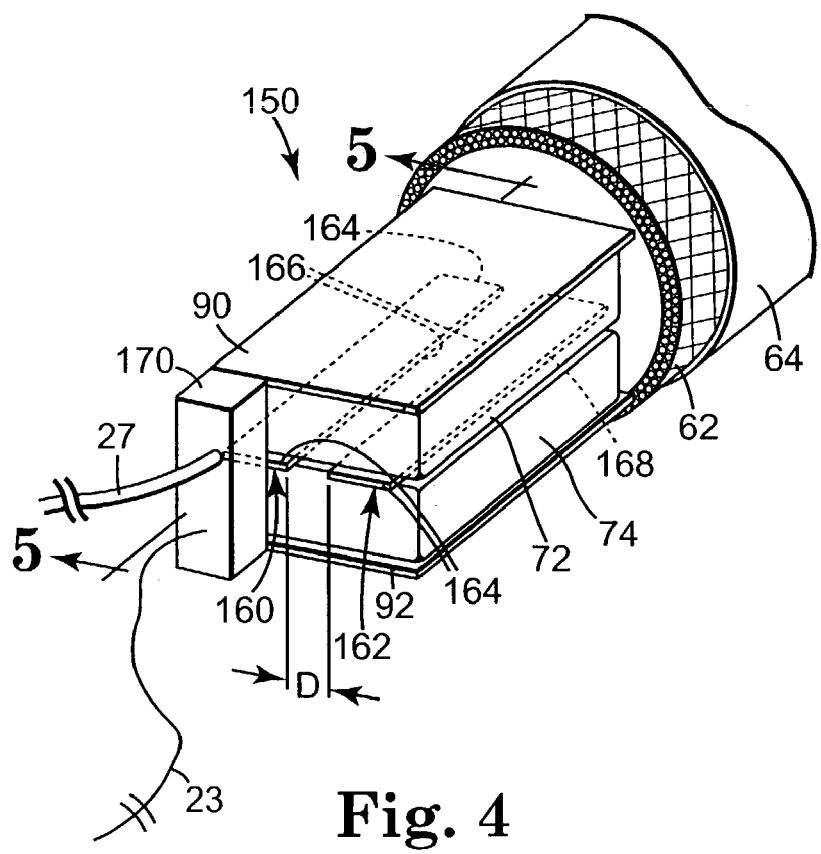
FIG. 4 is a perspective view of a test probe, according to an embodiment of the present invention.

As shown in FIG. 4, an embodiment of a test probe 150 of the present invention is also provided for testing signal attributes of a pair of target conductive elements that carry differential signals.

Test probe 150 comprises ground reference conductors 90 and 92, as well as first and second dielectric fluid chambers 72 and 74, which have substantially the same features and attributes as described in association with FIGS. 1–3. Probe 150 also comprises first signal conductor 160, second signal conductor 162, and manifold 170. Signal conductors 160 and 162 have ends 164, inner side edges 166, outer side edges 168, and body 169. First signal conductor 160 and second signal conductor 162 are sandwiched between first dielectric chamber 72 and second dielectric chamber 74, and are aligned with their longitudinal axes generally parallel to one another and their side edges 166 in a coupled arrangement. First signal conductor 160 and 162 are also aligned generally parallel to a longitudinal axis of ground reference conductors 90,92 and chambers 72,74. As shown in FIG. 4, inner side edges 166 of signal conductors 160 and 162 of probe 150 generally face each other (for edge coupling) and are spaced from each by a fixed distance D.

Figure 5:
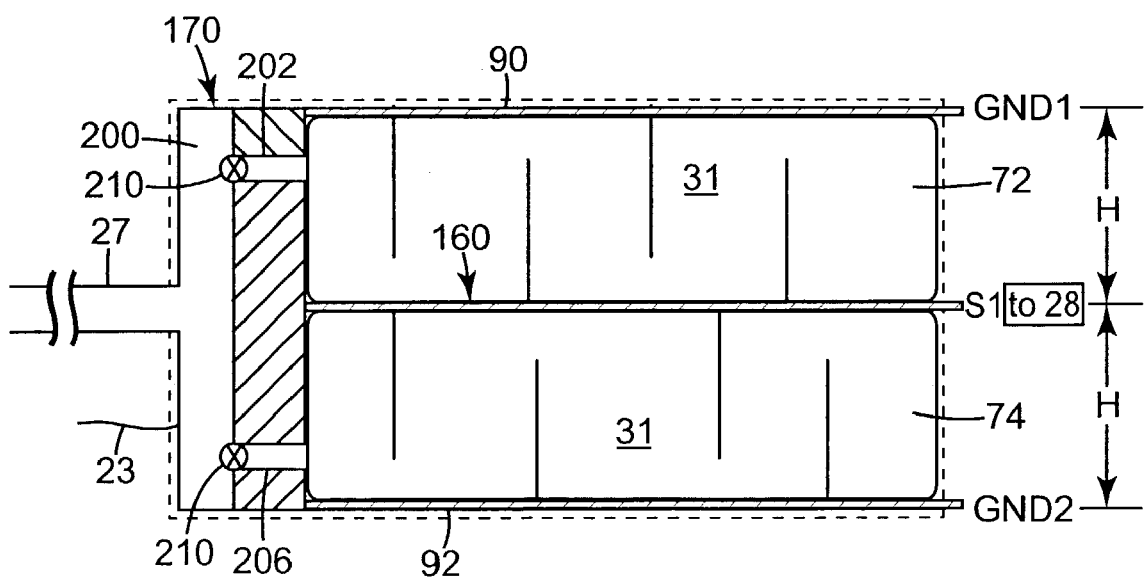
FIG. 5 is a sectional view of FIG. 4 as taken along lines 5—5.

FIG. 5 is a sectional view of probe 150 shown in FIG. 4 as taken along lines 5—5. As shown in FIG. 5, manifold 170 includes comprises fluid passageway 200, first port 202, second port 206, and valves 210. Fluid line 27 is in fluid communication with chambers 72 and 74 via ports 202, 206, and fluid passageway 200. Valves 210 are electrically controlled by fluid volume controller 44 of probe monitor 22 (FIG. 1) via electrical lines 23 and have a variably sized opening, as well as fully open and closed positions for regulating fluid flow through first port 202, second port 206 into respective chambers 72 and 74. In all other respects, manifold 170 carries substantially the same attributes and features as manifold 60, as described in association with FIG. 1–3.

Probe 150 has a differential impedance that is varied by the arrangement of signal conductors 160, 162 relative to the pair of ground reference conductors 90 and 92. This impedance is selectively varied by varying the spacing H between signal conductors 160, 162 relative to each of ground reference conductors 90 and 92. Adjusting the spacing H is accomplished by varying the volume of dielectric fluid within chamber 72 and chambers 74, respectively, via manifold 170 (and attendant pump 26, reservoir 24, probe monitor 22, etc as seen in FIG. 1). Despite this change in spacing H, the distance D between the signal conductors 160, 162 remains fixed. The impedance of test probe 150 is thereby selectively modified to approximate an impedance of target conductive elements 56 (FIG. 1) for enhancing accurate testing of signal attributes through the target conductive elements 56.

Either of test probes 20 or 150 of the present invention can be used for testing signal attributes in differential signal circuitry. However, because of the different arrangements of each of the test probes, with test probe 20 have broad-side coupled signal conductors and test probe 150 having edge-coupled signal conductors, these test probes 20, 150 use a different calculation to arrive at their respective impedances.

In an alternative arrangement, a single ended test probe of the present invention is provided for testing conventional signaling in single target conductive elements, such as for testing memory elements holding address information and data. For example, physical layer interface 12 (FIG. 1) can carry logic elements arranged for conventional signaling with target conductive elements that carry single signals. Accordingly, using one of test probes 230 or 250 of the present invention described below, one can test for signal attributes carried by a single target conductive element 56.

Figure 6:
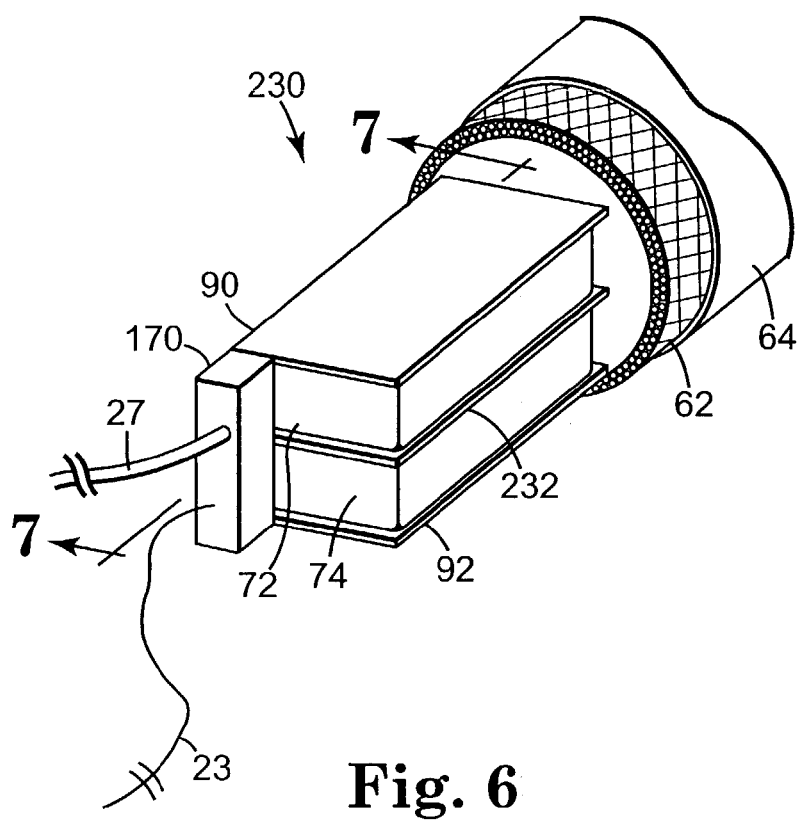
FIG. 6 is a perspective view of a test probe, according to an embodiment of the present invention.
Figure 7:
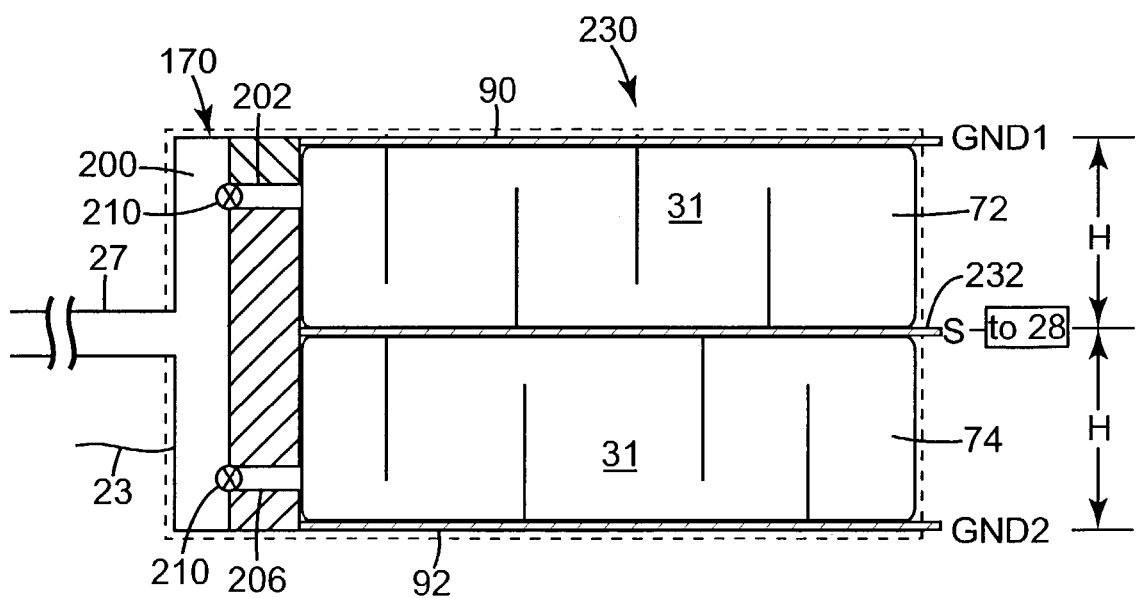
FIG. 7 is a sectional view of FIG. 6 as taken along lines 7—7.

As shown in FIGS. 6–7, an embodiment of a test probe 230 of the present invention provides a single-ended probe that can be substituted for probe body 20 of system 10. Test probe 230 comprises ground reference conductors 90, 92, as well as first and second dielectric fluid chambers 72 and 74. In addition, probe 230 includes single signal conductor 232 interposed between first dielectric fluid chamber 72 and second dielectric fluid chamber 74. Single signal conductor 232 is connected to either one of test leads 28 or 30 of system 10 to produce a single-ended test probe. Manifold 170 has substantially the same attributes and features as manifold 170 of FIGS. 4–5, and cooperates with chambers 72 and 74 for varying the volume of dielectric fluid within those chambers.

Test probe 230 has an impedance affected by the arrangement of signal conductor 232 relative to the pair of ground reference conductors 90 and 92. Other parameters affecting this impedance remain, such as other geometric relationships and materials, as previously described in association with FIGS. 1–3. This impedance is selectively varied by varying the spacing H between signal conductor 232 and ground reference conductors 90 and 92, which is accomplished by varying the volume of dielectric fluid within chamber 72 and chambers 74, respectively, via manifold 270 (and attendant pump 26, reservoir 241, probe monitor 22, etc. in seen in FIG. 1). The impedance of test probe 230 is thereby selectively modified to approximate (i.e., substantially match) an impedance of a target conductive element for enhancing accurate testing of signal attributes through the target conductive element. Alternatively, the impedance of test probe 230 is modified to any level suited for testing a signal attribute, as desired.

Figure 8:
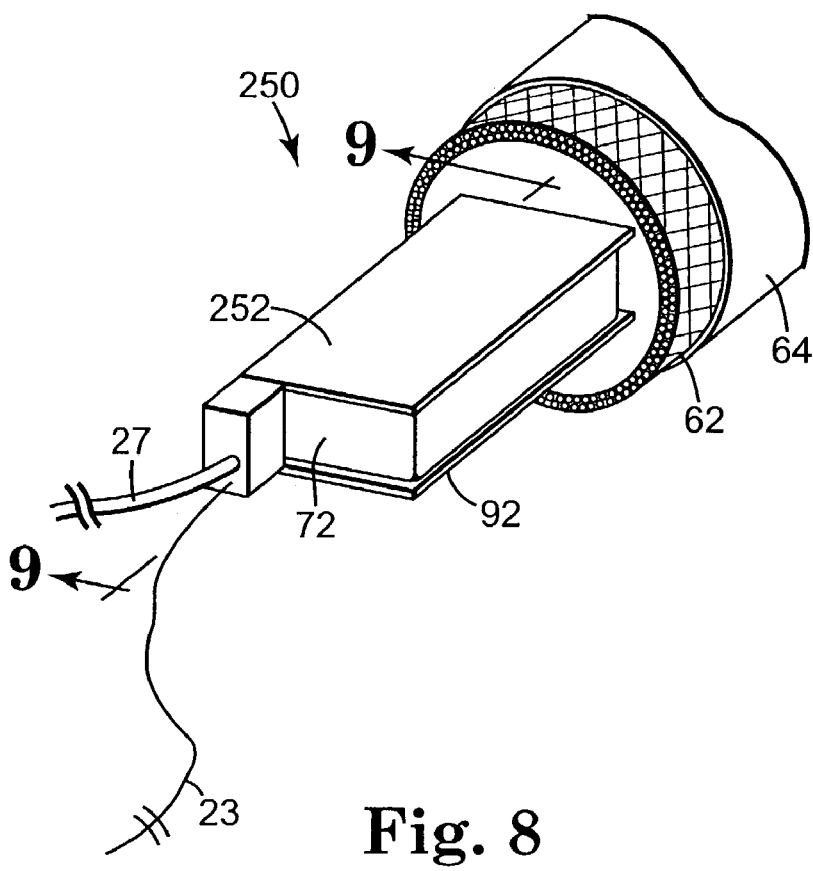
FIG. 8 is a perspective view of a test probe, according to an embodiment of the present invention.
Figure 9:
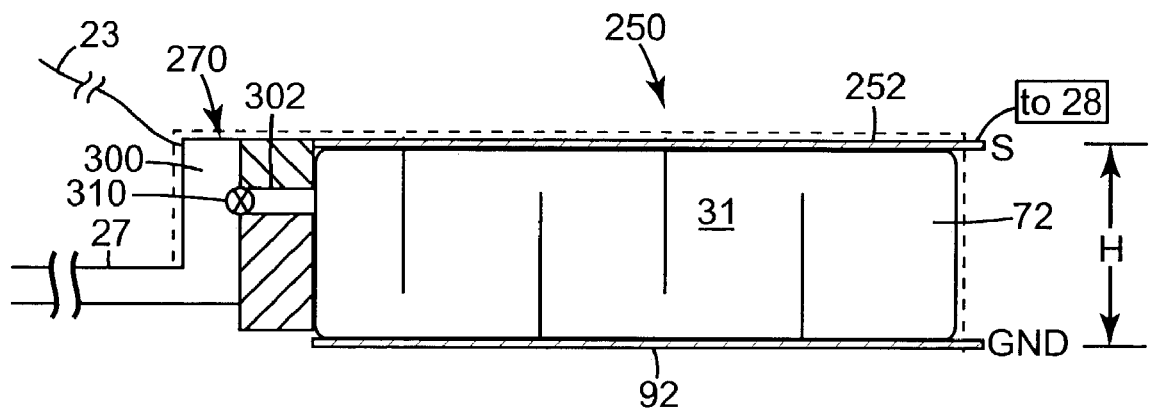
FIG. 9 is a sectional view of FIG. 8 as taken along lines 9—9.

As shown in FIGS. 8–9, an embodiment of a test probe 250 of the present invention also provides as single-ended test probe with variable impedance. Test probe 250 also can be substituted for probe body 20 in FIG. 1 of probe system 10, and comprises ground reference conductor 92, first dielectric fluid chamber 72, and signal conductor 252.

Manifold 270 comprises fluid passageway 300, port 302, and valve 310. Fluid line 27 is in fluid communication with chamber 72 via ports 302 and fluid passageway 300. Valve 310 is electrically controlled by fluid volume controller 44 of probe monitor 22 (FIG. 1) via electrical lines 23 and have a variably sized opening, as well as fully open and closed positions for regulating fluid flow through port 302 into chamber 72. In all other respects, manifold 270 carries substantially the same attributes and features as manifold 60, as described in association with FIG. 1–3.

Probe 250 has an impedance affected by the arrangement of signal conductor 252 relative to the pair of ground reference conductor 92. Other parameters affecting this impedance remain, such as other geometric relationships and materials, as previously described in association with FIGS. 1–3. This impedance is selectively varied by varying the spacing H between signal conductor 252 and ground reference conductor 92, by varying the volume of dielectric fluid within chamber 72 via manifold 270 (and attendant pump 26, reservoir 24, monitor 22, etc as seen in FIG. 1). The impedance of test probe 250 is thereby selectively modified to approximate (i.e., substantially match) an impedance of a target conductive element for enhancing accurate testing of signal attributes through the target conductive element. Alternatively, the impedance of test probe 250 is modified to any level suited for testing a signal attribute, as desired.

Finally, various modifications to the test probe of the present invention can be made. For example, a differential probe 20, 250 can be optionally be used as a single ended probe by collapsing one of its signal conductors 80, 82 against each other or collapsing one of signal conductors 80, 82 against its respective ground reference conductor 90, 92, recalculating the impedance of the probe, and then applying only one of test leads 28 or 30 as a single ended probe.

A test probe system of the present invention can enable selectively varying an impedance of the test probe to substantially match an impedance of a target conductive element to enhance testing for different signal attributes of a conductive element. The test probe of the present invention can include both single-ended arranged probes for conventional signal testing as well as double-ended arranged probes for differential signal testing.

While specific embodiments have been illustrated and described, herein for purposes of description of the preferred embodiment, it will be appreciated by those of ordinary skill in the art that a wide variety of alternate and/or equivalent implementations may be substituted for the specific embodiments shown and described without departing from the scope of the present invention. Those with skill in the chemical, mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A test probe comprising:
    a first conductor configured for carrying a first portion of a differential signal;
    a second conductor configured for carrying a second portion of a differential signal;
    a first variable dielectric chamber disposed between the first conductor and the second conductor and configured for holding a variable volume of dielectric fluid;
    a third ground reference conductor spaced from the first conductor;
    a second variable dielectric chamber disposed between the first conductor and the third ground reference conductor and configured for holding a variable volume of dielectric fluid to vary the distance between the first conductor and the third ground reference conductor;
    a fourth ground reference conductor spaced from the second conductor;

a third variable dielectric chamber disposed between the second conductor and the fourth ground reference conductor and configured for holding a variable volume of dielectric fluid to vary the distance between the second conductor and the fourth ground reference conductor; and wherein varying the volume of one or more of the first, second, and third chambers results in varying the differential impedance of the first conductor and the second conductors relative to the third and fourth ground reference conductors.

2. The probe of claim 1 and further comprising:

a fluid reservoir configured for holding the dielectric fluid;

a pump in fluid communication with the fluid reservoir and the first, second, and third dielectric fluid chambers and configured for increasing and decreasing a volume of dielectric fluid within the first, second, and third dielectric fluid chambers of the probe;

a manifold in fluid communication with, and disposed between, the pump and the probe and configured for selectively permitting flow of dielectric fluid between the pump and each of the first, second, and third chambers;

a fluid volume controller in electric and fluid communication with the pump and having a volume adjuster configured for directing, through the pump and the manifold, an increase or decrease of the volume of the dielectric fluid within each one of the first, second, and third chambers; and a chamber selector in electrical communication with the manifold and configured for directing the manifold to cause one or more of the first, second, and third dielectric fluid chambers to receive an increase or decrease in the dielectric fluid.

3. A variable impedance test probe comprising:

a first signal conductor and a first ground reference conductor;

a first dielectric element disposed between the first signal conductor and the first ground reference conductor and being configured to vary an impedance of the first signal conductor relative to the first ground reference conductor;

a second signal conductor;

a second ground reference conductor;

a second dielectric element disposed between the second signal conductor and the second ground reference conductor with the second dielectric element being configured to vary its volume for varying a distance between the second signal conductor and the second ground reference conductor to thereby vary an impedance of the second signal conductor relative to the first and second ground reference conductors; and a third dielectric element disposed between the first signal conductor and the second signal conductor with the third dielectric element being configured to vary its volume for varying a distance between the first signal conductor and the second signal conductor to thereby vary a differential impedance of the first and second signal conductors relative to the first and second ground reference conductors.

4. The probe of claim 3 wherein a longitudinal axis of the first and second signal conductors is generally parallel to a longitudinal axis of the first and second ground conductors, and a body of the first signal conductor generally faces a body of the second signal conductor.

5. A variable impedance test probe system comprising:

a test probe including:

a first signal conductor and a first ground reference conductor; and a first dielectric element disposed between the first signal conductor and the first ground reference conductor and being configured to vary an impedance of the first signal conductor relative to the first ground reference conductor, wherein the first dielectric element comprises a first dielectric fluid chamber disposed between the first signal conductor and the first ground reference conductor, and configured to hold a dielectric fluid and configured for inflation and deflation with the dielectric fluid to vary the impedance of the first signal conductor relative to the first ground reference conductor by varying the volume of the dielectric fluid within the first chamber, and thereby varying a distance between the first signal conductor and the first ground reference conductor; and at least one test lead electrically coupled to, and extending from the test probe, for measuring test signal attributes in at least one target conductive element.

6. The test probe system of claim 5 wherein the test probe further comprises:

a second signal conductor;

a second ground reference conductor;

a second dielectric element disposed between the second signal conductor and the second ground reference conductor with the second dielectric element being configured to vary its volume for varying a distance between the second signal conductor and the second ground reference conductor to thereby vary an impedance of the second signal conductor relative to the first and second ground reference conductors; and a third dielectric element disposed between the first signal conductor and the second signal conductor with the third dielectric element being configured to vary its volume for varying a distance between the first signal conductor and the second signal conductor to thereby vary a differential impedance of the first and second signal conductors relative to the first and second ground reference conductors.

7. The test probe system of claim 6 wherein a longitudinal axis of the first and second signal conductors is generally parallel to a longitudinal axis of the first and second ground conductors, and a body of the first signal conductor generally faces a body of the second signal conductor.

8. The test probe system of claim 5 and further comprising:

a fluid reservoir configured for holding the dielectric fluid;

a pump in fluid communication with the fluid reservoir and configured for controlling a volume of dielectric fluid within the first dielectric fluid chamber of the test probe; and a manifold in fluid communication with, and disposed between, the pump and the test probe and configured for selectively permitting flow of dielectric fluid into and out of the first dielectric fluid chamber.

9. The test probe system of claim 8 and further comprising a probe monitor including:

a fluid volume controller having a volume adjuster configured for directing, through the pump and the manifold, an increase or decrease of the volume of the dielectric fluid within the first dielectric fluid chamber.

10. A test probe comprising:

first means for carrying a first test signal relative to a ground reference;

first means for dielectrically varying an impedance of the first test signal relative to the ground reference;

first means, external to the first means for dielectrically varying an impedance and external to the first means for carrying, for applying the first test signal to at least one target conductive element;

second means for carrying a second test signal relative to the ground reference; and second means for dielectrically varying the impedance of the first test signal and the second test signal relative to the ground reference; and second means, external to the first and second means for dielectrically varying the impedance and external to the first and second means for carrying, for applying the second test signal to the at least one target conductive element.

11. The test probe of claim 10 wherein the ground reference comprises a first ground reference conductor and a second ground reference conductor, and wherein the first means for dielectrically varying an impedance comprises a first inflatable bladder and the first means for carrying comprises a first signal conductor and the first ground reference conductor, and the first inflatable bladder is disposed between the first signal conductor and the first ground reference conductor, and the first inflatable bladder is configured for holding a variably controlled volume of dielectric fluid and, wherein the second means for dielectrically varying an impedance comprises a second inflatable bladder and the second means for carrying comprises a second signal conductor and the second ground reference conductor, and the second inflatable bladder is disposed between the second signal conductor and the second ground reference conductor, and the second inflatable bladder is configured for holding a variably controlled volume of dielectric fluid.

12. A method of testing signal integrity attributes, the method comprising:

using at least one dielectric element to variably control an impedance of a probe, between a test signal conductor of the probe and a ground reference conductor of the probe, to substantially match an impedance of a pair of target conductive elements external to the probe wherein the test signal conductor and the ground reference conductor comprise a first test signal conductor of the probe spaced from a first ground reference conductor of the probe and a second test signal conductor of the probe spaced from a second ground reference conductor of the probe, and wherein the first test signal conductor is spaced from the second test signal conductor; and applying a test signal, via at least one test lead electrically coupled to and extending from the probe, to the pair of target conductive elements.

13. The method of claim 12 wherein using at least one dielectric element to variably control the impedance of the probe comprises:

varying the spacing between the first test signal conductor and second test signal conductor by controlling, via a pump, a first volume of dielectric fluid within a first inflatable chamber disposed between the spaced first test signal conductor and second test signal conductor; and varying the spacing between the first test signal conductor and the first ground reference conductor and between the second test signal conductor and the second ground reference conductor by controlling, via the pump, a second volume of dielectric fluid within each of a pair of second inflatable chambers, with one of the second inflatable chambers disposed between the first test signal conductor and the first ground reference conductor and the other second inflatable chamber disposed between the second test signal conductor and the second ground reference conductor.

14. A test probe comprising:

first means for carrying a first test signal relative to a ground reference including a first signal conductor and a first ground reference conductor;

first means, for dielectrically varying an impedance of the first test signal relative to the ground reference, including a first inflatable bladder disposed between the first signal conductor and the first ground reference conductor, and configured for holding a variably controlled volume of dielectric fluid; and means, external to the first means for dielectrically varying an impedance and the first means for carrying, for applying the first test signal to at least one target conductive element.

15. A method of testing signal integrity attributes in a pair of target conductive element, the method comprising:

arranging a test probe to include a first test signal conductor spaced from a second ground reference conductor, and a second test signal conductor spaced from a second ground reference conductor, and the first test signal conductor spaced from the second test signal conductor;

variably controlling an impedance of the probe to substantially match an impedance of the pair of target conductive elements by:

varying the spacing between the first test signal conductor and the second test signal conductor by controlling, with a pump, a volume of dielectric fluid within a first inflatable chamber disposed between the spaced first test signal conductor and the second test signal conductor; and varying the spacing between the first test signal conductor and the first ground reference conductor and between the second test signal conductor and the second ground reference conductor by controlling, with a pump, a volume of dielectric fluid within each of a pair second inflatable chambers, with one of the second inflatable chambers disposed between the first test signal conductor and the first ground reference conductor and the other second inflatable chamber disposed between the second test signal conductor and the second ground reference conductor; and applying a test signal from the test probe to the pair of target conductive elements.

* * * * *